United States Patent
Park

(10) Patent No.: US 6,974,747 B2
(45) Date of Patent: Dec. 13, 2005

(54) METHOD OF MANUFACTURING SEMICONDUCTOR DEVICE

(75) Inventor: Jeong Hwan Park, Ichon-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/740,089

(22) Filed: Dec. 18, 2003

(65) Prior Publication Data

US 2004/0266215 A1 Dec. 30, 2004

(30) Foreign Application Priority Data

Jun. 30, 2003 (KR) ................................. 10-2003-0043621

(51) Int. Cl.[7] ............................................. H01L 21/336
(52) U.S. Cl. ...................................... 438/257; 257/321
(58) Field of Search ........................ 257/49–57, 66–70, 257/315–321; 438/257–264, 593, 594

(56) References Cited

U.S. PATENT DOCUMENTS 5,597,760 A * 1/1997 Hirota .......................... 438/397
6,066,872 A * 5/2000 Okada et al. ................. 257/309
6,090,666 A * 7/2000 Ueda et al. ................... 438/257
2004/0102005 A1 * 5/2004 Dong et al. ................... 438/257

FOREIGN PATENT DOCUMENTS

| KR | 1998-55759 | 9/1998 |
| KR | 2000-41393 | 7/2000 |

* cited by examiner

Primary Examiner—David Nelms
Assistant Examiner—Calvin Lee
(74) Attorney, Agent, or Firm—Marshall, Gerstein & Borun, LLP

(57) ABSTRACT

The present invention relates to a method of manufacturing a semiconductor device. After an undoped amorphous silicon layer is formed, it is crystallized by means of a spike rapid thermal process so that the grain growth of a small size is facilitated. Therefore, while the grain size is formed uniformly and small, a grain cross-section of the small size, as a columnar structure, induces crystals grown in a direction perpendicular to the interface. It is therefore possible to reduce the surface roughness and accomplish an electrically uniform characteristic over the entire area.

9 Claims, 4 Drawing Sheets

METHOD OF MANUFACTURING SEMICONDUCTOR DEVICE

BACKGROUND

1. Field of the Invention

The present invention relates to a method of manufacturing a semiconductor device and, more specifically, to a method of manufacturing a semiconductor device capable of forming a grain size of a polysilicon layer small and uniform.

2. Discussion of Related Art

In recent years, as the level of the integration of the semiconductor device is increased, a device isolation film is formed by a self-aligned shallow trench isolation (SA-STI) process and a floating gate is therefore formed to have a stack structure in which first and second polysilicon layers are divided, in the process of fabricating a NAND flash memory device. In the above, the first polysilicon layer is formed using an undoped amorphous silicon layer. For this reason, a coarse grain size is formed due to a subsequent thermal process.

FIG. 1 is a TEM photograph showing that an amorphous silicon layer is crystallized by a thermal process.

Referring to FIG. 1, an approximate grain size is over about 200 nm by minimum. This size is more than twice the gate critical dimension. The grain boundary does not exist in a specific cell 1 and the grain boundary exists in a specific cell (in worse case, twin grain boundary). As such, as the grain size becomes large, variation in the program/erase threshold voltage of the flash memory cells whose operating principle is based on FN tunneling becomes great. For this reason, the erase speed of a specific cell whose grain boundary is relatively dense becomes faster than a common cell, thus becoming an over-erased cell. Such conditions are caused by reduction in the potential barrier height or electron trap due to the concentration of phosphorus that is relatively excessive in an oxide valley existing in the grain boundary region.

SUMMARY OF THE INVENTION

The present invention is directed to a method of manufacturing a semiconductor device capable of reducing the surface roughness and accomplishing an electrically uniform characteristic in the entire area, in such a manner that after an undoped amorphous silicon layer is formed, the undoped amorphous silicon layer is crystallized by means of a spike rapid thermal process so that the grain growth of a small size is facilitated, and the grain cross section of the small size having a columnar structure induces crystallization grown in a direction perpendicular to the interface while the grain size is formed uniformly and small.

According to a preferred embodiment of the present invention, there is provided a method of manufacturing a semiconductor device, including the steps of forming an amorphous silicon layer on a semiconductor substrate on which various components for forming a semiconductor device are formed, and previously crystallizing the amorphous silicon layer by means of a spike rapid thermal annealing process, to form a crystallized amorphous polysilicon layer whose grain size is small and uniform.

In the aforementioned of a method of manufacturing a semiconductor device according to another embodiment of the present invention, the amorphous silicon layer is an undoped amorphous polysilicon layer. The amorphous silicon layer is formed at a temperature of 300° C. to 600° C.

In the aforementioned of a method of manufacturing a semiconductor device according to another embodiment of the present invention, the spike rapid thermal annealing process is performed in an instant heating mode under a $N_2$ gas atmosphere at a step-up speed of 100° C./s to 300° C./s. The spike rapid thermal process is performed at a temperature of 900° C. to 1050° C. and the annealing process of the spike rapid thermal process is controlled so that the grain size formed in a columnar shape becomes smaller than 600 Å.

DETAILED DESCRIPTION OF PREFERRED EMBODIMENTS

Figure 1:
FIG. 1 is a TEM photograph showing that an amorphous silicon layer is crystallized by a thermal process.

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Meanwhile, in the specification, the phrase that a certain film is on another film or on a semiconductor substrate means that the certain film may directly contact the another film or the semiconductor substrate, or otherwise a third film may be interposed between them. Like reference numerals in drawings are used to identify the same or similar parts.

Figure 2A:
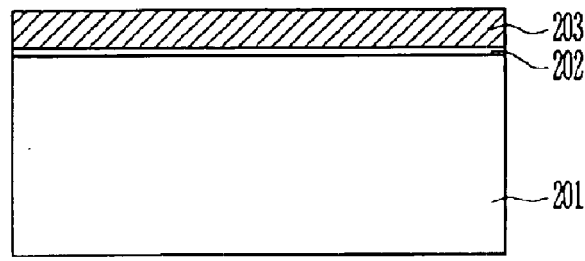
FIG. 2A to FIG. 2F are sectional views for explaining a method of manufacturing a semiconductor device according to an embodiment of the present invention.
Figure 2B:
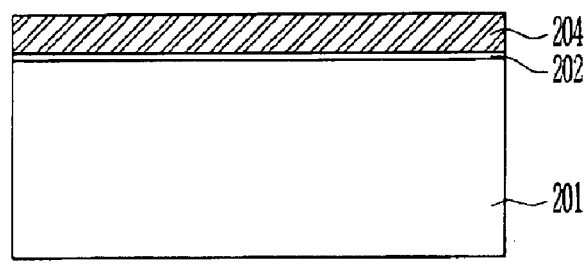
Figure 2C:
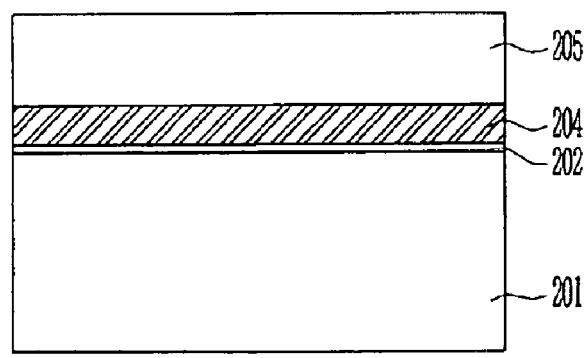
Figure 2D:
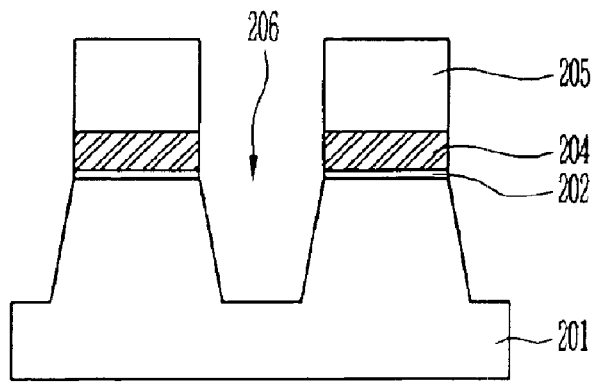
Figure 2E:
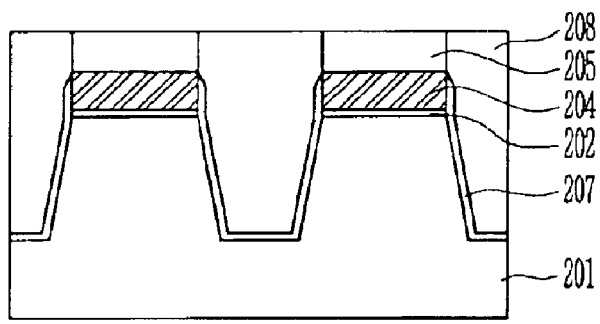
Figure 2F:
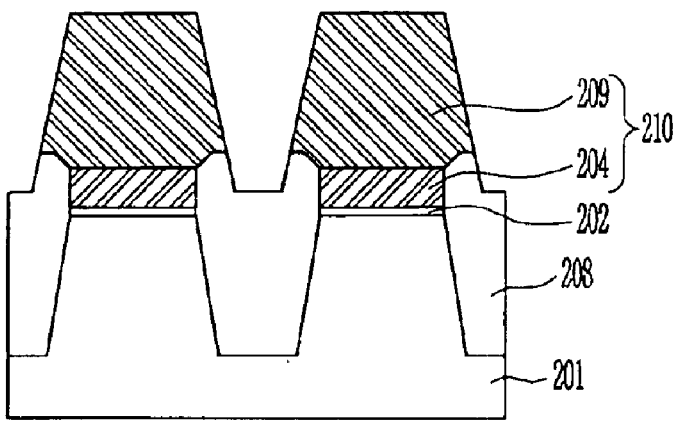
Figure 3:
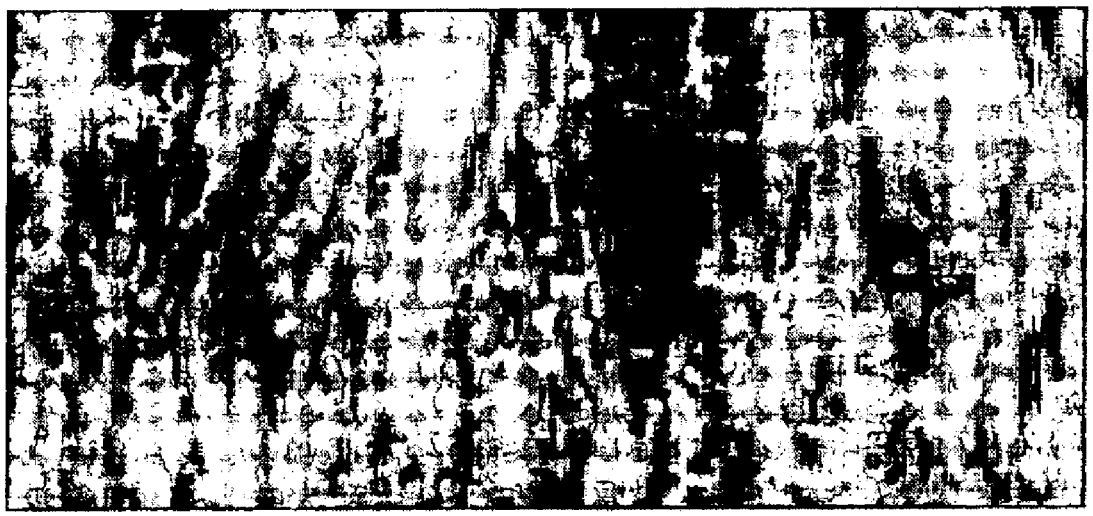
FIG. 3 is a TEM photograph showing a polysilicon layer that is grown in a columnar shape according to an embodiment of the present invention.

FIG. 2A to FIG. 2F are sectional views for explaining a method of manufacturing a semiconductor device according to an embodiment of the present invention, and FIG. 3 is a TEM photograph showing a polysilicon layer that is grown in a columnar shape according to an embodiment of the present invention.

Referring to FIG. 2A, a tunnel oxide film 202 and an undoped amorphous polysilicon layer 203 are sequentially formed on a semiconductor substrate 201. At this time, it is preferred that the undoped amorphous polysilicon layer 203 is formed in thickness of 200 Å to 600 Å at a temperature of 300° C. to 600° C.

By reference to FIG. 2B, the undoped amorphous polysilicon layer (see '203' in FIG. 2A) is experienced by a spike rapid thermal process being an instant heating mode so that it has a grain small and uniform. The undoped amorphous polysilicon layer (see '203' in FIG. 2A) is previously crystallized to form a crystallized polysilicon layer 204. At this time, the spike rapid thermal process is performed under a $N_2$ gas atmosphere at a step-up speed of 100° C./s to 300° C./s at a temperature of 900° C. to 1050° C. Further, the spike rapid thermal process can be performed depending on the level of integration and process conditions so that the grain size having a columnar structure becomes smaller than 600 Å.

The spike rapid thermal process is performed under these conditions to previously crystallize the undoped amorphous polysilicon layer (see '203' in FIG. 2A), thereby uniformly forming the small grain as shown in FIG. 3. Furthermore, the cross section of the small grain has the columnar structure to induce crystallization grown in a direction perpendicular to the interface, thus reducing the surface roughness. Also, this can stabilize the interface with an ONO dielectric film after a polysilicon layer is formed in a subsequent process.

As such, by forming the polysilicon layer 204 that has a small and uniform grain size and has a good surface roughness by means of the spike rapid thermal annealing process, a uniform electrical characteristic can be obtained in the entire region of the polysilicon layer 204.

With reference to FIG. 2C, a pad nitride film 205 is formed on the entire surface of the structure. The pad nitride film 205 may be formed by means of a LP-CVD method and may be formed in thickness of about 700 Å to 1200 Å.

Referring to FIG. 2D, the pad nitride film 205, the crystallized polysilicon layer 204 and the tunnel oxide film 202 on an isolation region are sequentially etched by means of an etch process using an isolation mask, thus defining the isolation region. For this reason, the surface of the semiconductor substrate 202 in the isolation region is exposed. The semiconductor substrate 201 of the isolation region is then etched by a given depth by means of a trench etch process, thus forming a trench 206.

In the above, the trench etch process is process so that an angle of inclination of the sidewall of the trench 206 becomes 80° to 88°.

By reference to FIG. 2E, in order to cure silicon damage caused by ion shock of a high energy while the trench etch process is performed or make the top and bottom corners of the trench 206 rounded at the same time, the sidewalls and bottoms of the trench 206 are oxidized by a sidewall oxidization process. Thereby thermal oxide films 207 are formed at the sidewalls and bottoms of the trench 206.

The sidewall oxidization process may be performed in a dry oxidization mode or a wet oxidization mode. It is preferred that the sidewall oxidization process is performed at a temperature of 800° C. to 900° C. in order to prevent second recrystallization in which the grain of the crystallized polysilicon layer 204 is excessively grown. Meanwhile, it is preferred that the sidewall oxidization process is performed so that the thermal oxide film 207 is formed in thickness of 30 Å to 100 Å.

Thereafter, the trench 206 is filled with an insulating material to form a device isolation film 208. At this time, the trench 206 is preferably buried with a high-density plasma (HDP) oxide. The HDP oxide formed on the pad nitride film 205 is removed by a chemical mechanical polishing (CMP) process.

With reference to FIG. 2F, the pad nitride film (see '205' in FIG. 2E) is removed. At this time, the pad nitride film (see '205' in FIG. 2E) may be removed using phosphoric acid ($H_3PO_4$).

Next, after a polysilicon layer 209 is formed on the entire surface of the structure, the polysilicon layer 209 on the device isolation film 208 is partially removed by an etch process, thus forming a polysilicon layer 209 that is isolated from neighboring cells in a word line direction.

The polysilicon layer 209 may be formed by means of the LP-CVD method using a $SiH_4$ or $Si_2H_6$ and $PH_3$ gas. More particularly, the polysilicon layer 209 may be formed in thickness of 1000 Å to 2000 Å by means of the LP-CVD method, for example at a temperature of 510° C. to 550° C. and in a pressure of 0.1 Torr to 3 Torr. At this time, it is preferrable that the P concentration doped into the polysilicon layer 209 is controlled to be about 1.0E20 to 2.0E20 atoms/cc.

Meanwhile, the etch process for patterning the polysilicon layer 209 is performed in a vertical or an inclination etch mode so that the distance between the polysilicon layers 209 is secured.

In the above, the polysilicon layer 209 electrically contacts the crystallized polysilicon layer 204 to form a floating gate 210. The polysilicon layer 209 serves to increase the area of the floating gate 210.

Thereby the flash memory cell is manufactured.

As described above, according to the present invention, the grain size of the polysilicon layer is formed small and uniformly, thus making uniform the grain density existing per cell. This reduces variation in the program erase threshold voltage the between the cells. Therefore, the present invention has an effect that it can improve electrical characteristics and reliability of the device.

Furthermore, as an amorphous undoped polysilicon layer is crystallized by means of a spike rapid thermal process, it is possible to effectively prohibit degradation of the surface roughness. A polysilicon chemical mechanical polishing process that is additional and difficult to control such as a case where a high temperature doped polysilicon is used, may be omitted. Further, it is advantageous to improve a charge retention characteristic in case of a flash memory device.

Also, the present invention can employ the existing equipments and processes without complicated processes and additional equipments. It is possible to manufacture a device with low cost and high reliability.

In addition, in the present invention, a silicon layer is experienced by a spike rapid thermal process in advance. When the manufacturing of a flash memory device is completed or the flash memory device is decapped, a fine structure of a polysilicon layer for a floating gate can be controlled within up to 1000 Å.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of manufacturing a semiconductor device, comprising the steps of:
    forming an amorphous silicon layer on a semiconductor substrate on which various components for forming a semiconductor device are formed; and
    previously crystallizing the amorphous silicon layer by means of a spike rapid thermal annealing process, to form a crystallized amorphous polysilicon layer of which grain size is small and uniform,
wherein the spike rapid thermal annealing process is performed in an instant heating mode under a $N_2$ gas atmosphere at a step-up speed of 100° C./s to 300° C./s.

2. The method as claimed in claim 1, wherein the amorphous silicon layer is an undoped amorphous polysilicon layer.

3. The method as claimed in claim 1, wherein the amorphous silicon layer is formed at a temperature in the range of 300° C. to 600° C.

4. The method as claimed in claim 1, wherein the spike rapid thermal process is performed at a temperature of 900° C. to 1050° C. and the annealing process of the spike rapid thermal process is controlled so that the grain size formed in a columnar shape becomes smaller than 600 Å.

5. A method of manufacturing a semiconductor device, comprising the steps of:

forming a tunnel oxide film on a semiconductor substrate;

forming an amorphous silicon layer on the tunnel oxide film;

previously crystallizing the amorphous silicon layer by means of a spike rapid thermal annealing process, to form a crystallized amorphous polysilicon layer of which grain size is small and uniform;

forming a pad nitride film on the crystallized amorphous polysilicon layer;

removing the pad nitride film, the crystallized amorphous polysilicon layer and the tunnel oxide film on an isolation region;

forming a trench in the semiconductor substrate of the isolation region;

forming thermal oxide films at sidewalls and bottoms of the trench by means of a sidewall oxidization process;

burying the trench with an insulating material to form a device isolation film; and forming a polysilicon layer on the entire surface of the structure and then removing a portion of the polysilicon layer on the device isolation film to form a floating gate consisting of the crystallized amorphous polysilicon layer and the polysilicon layer, wherein the spike rapid thermal annealing process is performed in an instant heating mode under a $N_2$ gas atmosphere at a step-up speed of 100° C./s to 300° C./s.

6. The method as claimed in claim 5, wherein the amorphous silicon layer is an undoped amorphous polysilicon layer.

7. The method as claimed in claim 5, wherein the amorphous silicon layer is formed at a temperature in the range of 300° C. to 600° C.

8. The method as claimed in claim 5, wherein the spike rapid thermal process is performed at a temperature of 900° C. to 1050° C. and the annealing process of the spike rapid thermal process is controlled so that the grain size formed in a columnar shape becomes smaller than 600 Å.

9. The method as claimed in claim 5, wherein the sidewall oxidization process is performed at a temperature where a second recrystallization that a grain of the crystallized amorphous polysilicon layer is excessively grown can be prevented.

* * * * *